United States Patent [19]

Singer

[11] Patent Number: 5,269,698
[45] Date of Patent: Dec. 14, 1993

[54] RETAINING AND RELEASE MECHANISM FOR COMPUTER STORAGE DEVICES INCLUDING A PAWL LATCH ASSEMBLY

[75] Inventor: Richard Singer, Menlo Park, Calif.

[73] Assignee: Silicon Graphics, Inc., Mountain View, Calif.

[21] Appl. No.: 9,576

[22] Filed: Jan. 26, 1993

[51] Int. Cl.⁵ .......................................... H01R 13/00
[52] U.S. Cl. .................................................... 439/157
[58] Field of Search ............................. 439/152-160

[56] References Cited

U.S. PATENT DOCUMENTS

| | | |
|---|---|---|
| 2,897,033 | 7/1959 | Ford . |
| 3,488,622 | 1/1970 | Gley .................................. 439/157 |
| 3,784,954 | 1/1974 | Grimm et al. . |
| 4,071,722 | 1/1978 | Hart .................................. 439/157 |
| 4,614,389 | 9/1986 | Albert et al. . |
| 4,717,982 | 1/1988 | Toreson et al. . |
| 4,931,907 | 6/1990 | Robinson et al. . |
| 4,960,384 | 10/1990 | Singer et al. . |
| 4,982,303 | 1/1991 | Krenz . |
| 5,003,431 | 3/1991 | Imsdahl . |
| 5,010,426 | 4/1991 | Krenz . |
| 5,035,634 | 7/1991 | Hasircoglu et al. . |
| 5,045,960 | 9/1991 | Eding . |
| 5,135,410 | 8/1992 | Kawase et al. ..................... 439/157 |
| 5,155,662 | 10/1992 | I-Shou . |

FOREIGN PATENT DOCUMENTS

1251250A1 8/1986 U.S.S.R. .

Primary Examiner—Joseph H. McGlynn
Attorney, Agent, or Firm—Blakely, Sokoloff, Taylor, Zafman

[57] ABSTRACT

An assembly that couples a removable computer component to a computer is disclosed. The assembly has a disk drive or other similar device that is mounted onto a frame and is insertable into the opening of a computer housing. At one end of the opening is a first electrical connector mounted onto a rear wall of the housing. The disk drive is coupled to a second connector mounted onto the front end of the frame. The frame is inserted into the opening until the second connector mates with the first connector, thereby electrically coupling the disk drive to the computer.

The housing includes a bearing extending from a support plate that structurally supports the frame and disk drive. The bearing is adapted to be engaged by a lever that is pivotally connected to the frame. The disk drive is secured to the housing by rotating the lever from a first position to a second position, such that the lever latches onto the bearing.

20 Claims, 2 Drawing Sheets

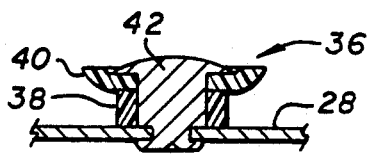
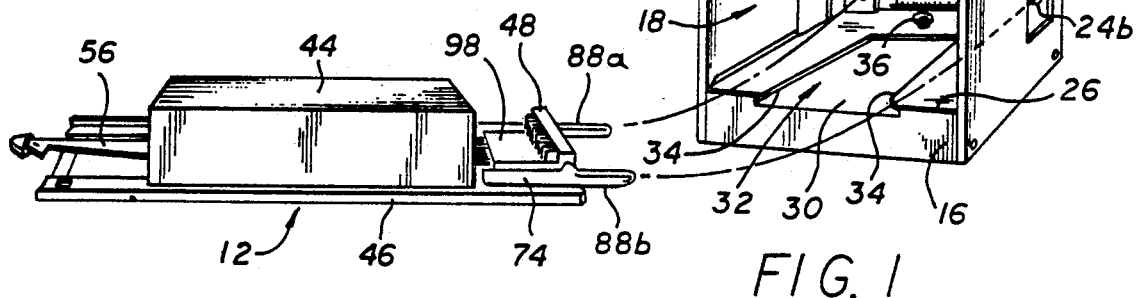
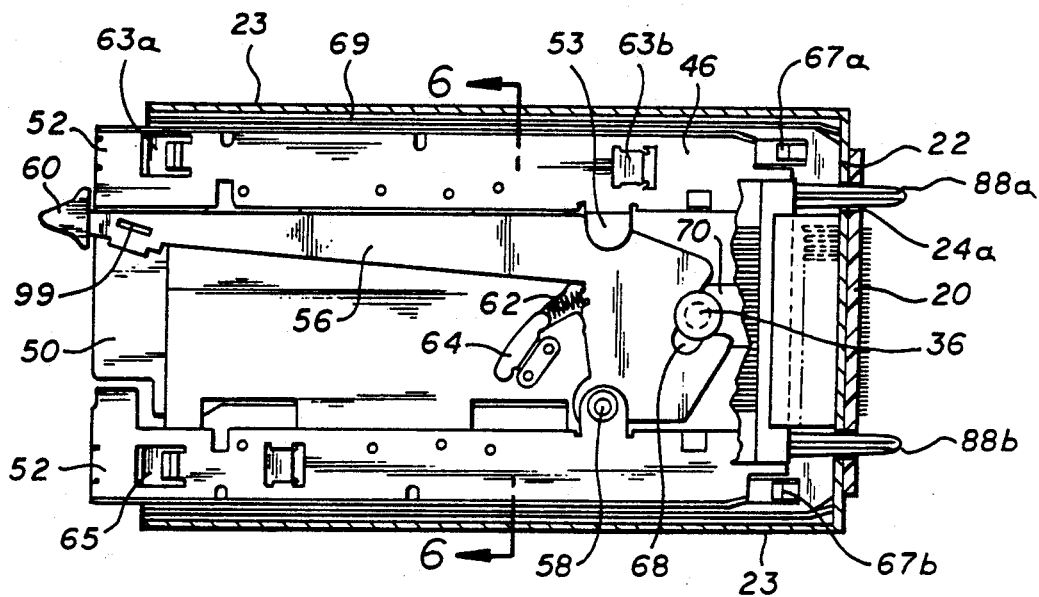
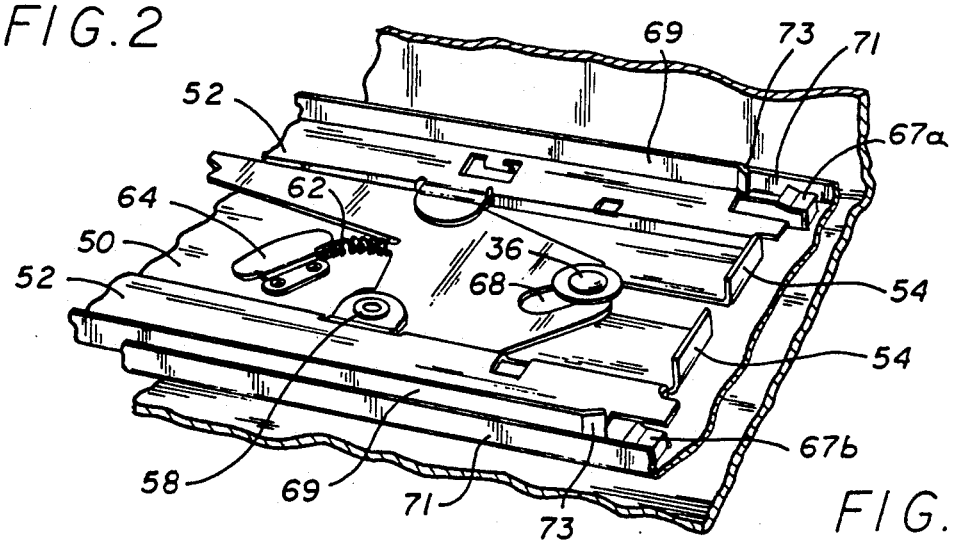

RETAINING AND RELEASE MECHANISM FOR COMPUTER STORAGE DEVICES INCLUDING A PAWL LATCH ASSEMBLY

BACKGROUND OF THE INVENTION

1. Field of the Invention

The present invention relates to an apparatus that facilitates the fast and easy installation or removal of a removable computer component into or out of a computer. More particularly, the present invention relates to a pawl latching and retaining device for retaining and releasing a removable disk drive in a computer. The removable computer component may otherwise be floppy disk drives, optical disk drives and the like.

2. Description of Related Art

Mass storage devices including so called Hard Disk Drives are commonplace components of modern personal computers. As these devices have a far higher storage capacity than the standard Floppy Disk Drive, transferring a substantial fraction of the data capacity of a hard disk from one computer to another via floppy disks is impractical. This poses problems for computer users who may need access to the data on a hard disks on different computers at different locations.

On the other hand, in offices where there are fewer computers than personnel, so that the computer users must share a single computer, it is desirable to provide a computer system where the data is interchangeable for each user. In situations involving security information, it is particularly important that the data is not available to others, and therefore, the removal of the disk drives may be desirable.

Thus, an existing solution to these problems is to make the disk drive removable, whereby one disk drive can be exchanged between different computers or different disk drives can be exchanged by different users of a single computer. Advantages of an easily removable disk drive include easy exchange of databases on a given computer, improved data security because the drive can be removed and stored in a physically secure location, and also easy removal to facilitate repair and service of the disk drive. Also, there is no need to manually disconnect any of the cables prior to removal if appropriate electrical disconnects are incorporated into the design.

Additionally, such removable disk drive systems are a means for efficiently utilizing expensive disk drives. To illustrate, a user may have several computers each lacking an expensive, specialized disk drive. But with a single removable disk drive, all of the computers can be served by such a removable drive as needed.

A number of systems that facilitate the installation and/or removal of disk drives are known in the art. U.S. Pat. Nos. 4,633,350 and 4,912,580 to Hanson and U.S. Pat. No. 4,979,909 to Andrews disclose two such systems. In Hanson, the drive is held in a carrier module which is manually inserted into a receiving unit mounted in the computer. The force of insertion engages connectors which link the drive to the computer. Removal is accomplished by simply pulling the drive out by a handle. Similarly, Andrews features fully manual insertion and extraction, but adds a barb-like engagement member attached to a side member which is mounted on the drive. The barb engages a support frame, which is mounted in the computer, to hold the drive in place. The barb can be released by turning a lever which in turn presses the barb back away from the frame.

U.S. Pat. No. 4,982,303 to Krenz provides a different mechanism for locking the drive in place. Krenz features a latch mounted across the face plate of the drive. A handle turns a gear which mates with an internal sector gear which is part of a lever member that also features a tongue. When the handle is pushed toward the drive face, the tongue moves in the opposite direction. The tongue is positioned to engage a side of a channel member, whereby contact between the tongue and the front side of the channel cause the drive to lock in place when the handle is depressed. Similarly, when the handle is pulled, the tongue engages the rear side of the channel to help break the connection between drive and computer.

Pawl latches have typically been used to retain circuit boards within rack mount assemblies of computers. These pawl latches are affixed to one or two corners of the circuit board and engage and latch to a portion of the rack mount when the board is fully inserted. To release the board, the pawl latch(es) is pulled forward until it disengages from the rack mount. However, these pawl latch mounts have not been adapted for use with computer components other than circuit boards, and are generally used only by trained computer service and assembly personnel, and not by general computer users. Another prior art device is believed to be distributed by Compaq. It includes a circuit board with a disk drive mounted on the circuit board. A pair of pawl latches, one disposed on each of two leading edges, are used to latch the circuit board in place in a computer housing as previously described.

U.S. Pat. No. 4,960,384 relates to a retaining and release device for computer components, such as removable hard disk drives, which comprised a retaining and release mechanism disposed in a side wall of a housing for the computer component. The device comprised a pivoting bar having a flange at one end which engaged the forward edge of the computer component and a flange near the middle of the bar which extended through the wall of the housing to lock the computer component in place. The pivoting bar at its other end is angled away from the housing so that a release mechanism which engaged the bar at its angled portion pushed the bar away from the housing which pivoted the flange to release the computer component. Thus, this device, while it functioned well, required significant space on the side of the housing for successful operation in most cases.

In copending application Ser. No. 07/734,142, in the preferred embodiment, smooth engagement and disengagement of the electrical connectors linking the data storage drive to the computer are achieved by a rack and pinion mechanism. The rack is formed into a carrier tray which itself is immovably mounted inside a data drive cavity in a computer housing. A drive sled adapted for mounting to the bottom of the data storage drive housing has a complementary pinion gear designed to mesh with the rack. A lever extends radially from the center of the pinion and is used to actuate the pinion. The drive sled has angled tracks formed into its underside that interlock with another set of angled tracks formed into the top of the carrier tray. These interlocking angled tracks facilitate alignment of the data storage drive when it is inserted into the computer, and secure the drive sled to the carrier tray. In this design, a minimum of about ⅜ of an inch is required to house the retaining and release components of the invention. Accordingly, the device does not permit close or tight stacking of multiple disk drives, with a maximum efficiency, within a constrained space. This device has been incorporated into a commercial embodiment which is presently being manufactured and sold by the assignee of the present application.

It is thus desirable to provide a computer assembly which makes more efficient use of the space underneath the disk drive or other component. It is also desirable to provide a removable disk drive that can be coupled into the housing of the computer. It is also desirable to provide a removable hard disk drive with electrical connectors that can be plugged directly into the computer. The removable disk drive unit should also have a locking mechanism which prevents the connector from being inadvertently detached from the computer. The locking mechanism should be easy to use. Because computers are sometimes subjected to shock and vibration, the sled or other retaining device which holds the removable disk drive should also be sufficiently rigid and sufficiently secured to the housing to prevent undesirable flexure.

SUMMARY OF THE INVENTION

The present invention is an assembly for a removable and connectable component for a computer. In the preferred embodiment, the present invention is a removing and retaining system for a removable disk drive assembly which couples and secures a hard disk drive or the like into a housing in a computer. One portion of the assembly of the present invention is a sled which may be coupled to a disk drive or other similar device. The other portion of the assembly is a track for the sled, which is installed and affixed in a cavity in the computer housing, and the two portions are designed to mate with each other to retain the disk drive within the computer housing.

The present invention is primarily directed to a pawl latch assembly which retains a disk drive in the computer housing. The housing includes a shouldered roller bearing extending from a support plate that structurally supports both the sled and drive unit. The roller bearing is adapted to be engaged by a lever that is pivotally connected to the sled which is attached to the disk drive. The disk drive is secured to the housing by pivoting the lever from a first position to a second position, such that the lever latches onto the roller bearing. In pivoting the lever, the disk drive is drawn further into the cavity, which causes the electrical connectors for the disk drive and in the computer to mate and interconnect as described below.

A first electrical connector is mounted onto a rear wall of the portion installed in the computer housing. The disk drive is coupled to a second electrical connector mounted onto the front end of the disk drive sled. The sled is inserted into the opening until the second connector mates with the first connector, thereby electrically coupling the disk drive to the computer.

To install the disk drive in the computer using the present invention, the user pushes the sled with the disk drive mounted thereon into the housing opening until the second connector engages the first connector. The user then pivots the lever from the first position to the second position, so that the lever's slot engages the roller bearing and secures the disk drive to the housing. The engagement of the lever and roller bearing also moves the disk drive toward the rear wall to further engage the connectors. The sled has a detent that locks the lever in the second position. The disk drive can be detached from the computer by simply unlocking and rotating the lever, and then sliding the sled out of the housing.

The assembly includes several sets of hold tabs that extend between the sled and the support plate to prevent vertical and lateral movement of the drive unit when installed, for protection against excessive vibration.

The sled may include a pair of guide pins that are inserted into alignment holes in the rear wall of the housing. The guide pins align the first and second connectors when the drive unit is inserted into the housing. The guide pins extend from a connector frame which is attached to the second connector and the sled. The connector frame allows the second connector to "float" relative to the sled, so that the first and second connectors become aligned before being pressed together. The floating feature of the connector compensates for tolerances in the overall assembly.

It is therefore an object of the present invention to provide a disk drive unit that can be plugged into and subsequently removed from a computer.

It is also an object of the present invention to provide a removable disk drive with a simple locking mechanism.

It is also an object of the present invention to provide a removable disk drive that can be securely fastened to a computer housing.

It is also an object of the present invention to provide a removable disk drive retaining and release mechanism with a low profile for efficient use of space.

BRIEF DESCRIPTION OF DRAWINGS

The objects and advantages of the present invention will become more readily apparent to those ordinarily skilled in the art after reviewing the following detailed description and accompanying drawings:

FIG. 1 is a perspective view of an assembly of the present invention showing a disk drive unit disposed on a sled and a housing;

FIG. 1a is a cross-sectional view of a roller bearing mounted to a support plate of the housing;

FIG. 2 is a sectional view taken from the top of the present invention in FIG. 1 installed in the housing without the disk drive;

FIG. 3 is a perspective cut-away view of a section of the disk drive sled assembly with the disk drive removed;

DETAILED DESCRIPTION OF THE INVENTION

Figure 4:
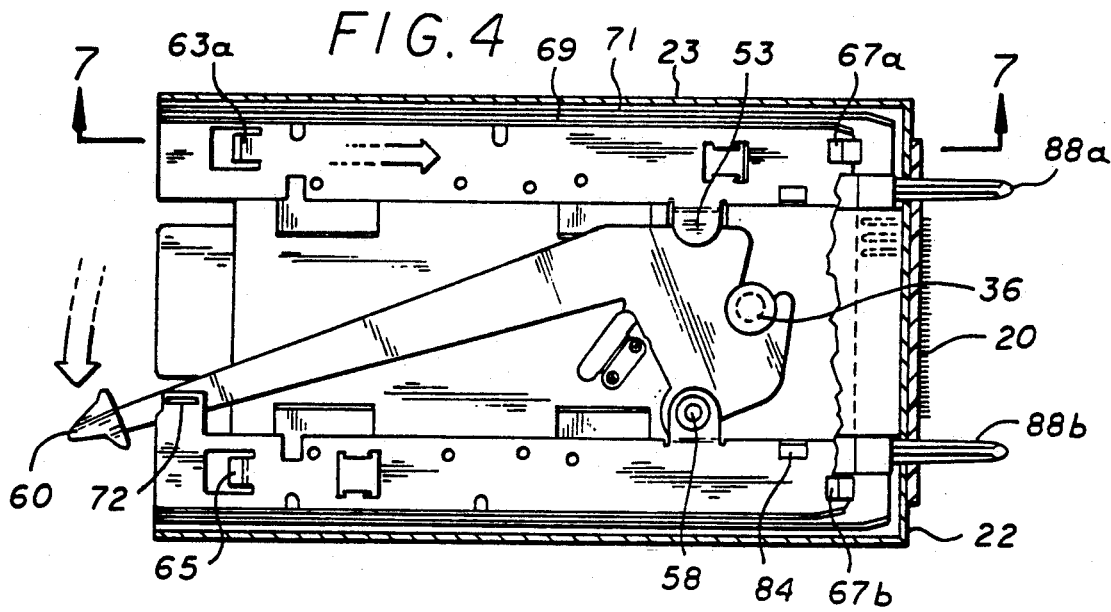
FIG. 4 is a cross-sectional view similar to FIG. 2, showing a lever of the disk drive unit rotated into engagement with a roller bearing that is attached to the computer housing.

Referring to the drawings more particularly by reference numbers, FIG. 1 shows an assembly 10 of the present invention. The assembly 10 includes a disk drive assembly 12 that can be plugged into a track 26 which is installed in a cavity in a computer system. The track 26 may contain, or be coupled to, other computer components. In the preferred embodiment, the track 26 is part of a workstation or a personal computer. The housing 14 simulates the computer housing and has a front face 16 that is generally accessible to the user, so that the disk drive 12 can be readily inserted and removed from the computer (not shown). The height of the housing 14 is preferably of suitable height to accommodate a half height or full height drive as is standard in the industry.

The housing 14 has an opening 18 and a first electrical connector 20, which provides communication between disk drive assembly 12 or other computer component and the computer. The connector 20 is mounted to a rear wall 22 of the housing 14 by a fastening means such as a set of screws. The rear wall 22 also has a pair of alignment holes 24a and 24b that are aligned with the pins 88a and 88b of connector frame 74. The housing 14 has a pair of side walls 23.

The housing 14 also has a support plate 26 with a first surface 28 and a second surface 30. The support plate 26 has a slot 32 which exposes the second surface 30 and defines a pair of alignment rails 34 of the plate 26. The alignment rails 34 provide a means of guiding the disk drive sled assembly 12 into the opening 18.

Attached to the first surface 28 of the plate 26 is a roller bearing 36. As shown in FIG. 1a, the roller bearing 36 has a body 38 with a head 40. The body 38 and head 40 are coaxially mounted on a fixed post or rivet 42 which extends through and is attached to the support plate 26. The body 38 is constructed to rotate relative to the fixed post 42 and support plate 26. The rotation of the body 38 minimizes the wear of the body and permits even wear around all sides of the body to prevent grooves from being formed in the surface. The roller bearing 36 can be constructed from a material of limited friction, such as DELRIN or TEFLON.

The disk drive assembly 12 includes a disk drive module 44 mounted onto a sled 46. The disk drive module 44 typically contains a hard disk drive and accompanying components used to store information from the computer. Although a hard disk drive is described, it is to be understood that other electrical assemblies can be used in the present invention. For example, the module may be a floppy disk drive used to read/write floppy disks. Instead of a disk drive, the unit may contain a power supply or a circuit board with memory or logic elements.

The disk drive module 44 is coupled to a second electrical connector 48 which is attached to the sled 46 via connector frame 74. A flat cable or circuit board may be used to interconnect the module 44 and connector 48. A second connector (not shown) provides a cabled interface to the disk drive module 44. A circuit board 98 snaps into the connector frame 74 and is soldered to connector 48.

As shown in FIG. 2, the sled 46 has a lower mid-base portion 50 which extends along the longitudinal axis of a lateral base portion 52 so that a groove is formed to provide a channel for the lever 56 to be disposed and a base upon which either a 3.5 inch or 5.25 inch drive can be mounted. As shown in FIG. 3, the front end of the lower mid-base portion 50 has a pair of abutment tabs 54 that extend essentially perpendicular to the lateral base portion 52. The tabs 54 are located adjacent to the second connector 48 and are constructed to engage the flange rail 92 of the connector frame 74 (see FIG. 5).

Disposed on the mid-base portion 50 is a lever 56 that is pivotally connected to the sled 46 by a pin 58. Because the mid-base portion 50 is in a different, but parallel, plane than that of the lateral base portion 52, a gap is provided which permits the lever 56 to be installed between the sled 46 and the disk drive 44. The lever 56 has a handle portion 60 that partially extends from the sled 46, so that a user can rotate the lever 56 between a first position and a second position. Attached to the lever 56 is a compression spring 62 that biases the lever in the first position shown in FIG. 2. The spring 62 is captivated at its ends between the lever 56 and the sled 46, and a bracket 64 is disposed above the spring 62 to prevent it from coming out of the slot in which it is disposed. The spring 62 is preferably arcuate in shape to conform to the rotational movement of the lever 56. A bracket 53 also retains the lever 56.

The lever 56 has a jaw 66 that defines a slot 68. The slot 68 is adjacent to a channel 70 located in the front portion of the sled 46. The channel 70 provides an aperture for the roller bearing 36, so that the sled assembly 12 can be inserted into the opening 18 and the sled 46 can slide along the support plate 26 until the second connector 48 engages the first connector 20. The lever 56 and roller bearing 36 are assembled so that the jaw 66 is adjacent to the roller bearing 36 when the disk drive assembly 12 is inserted into the housing 14.

As shown in FIG. 4, once the drive assembly 12 is pushed into the housing 14, the lever 56 is rotated toward the second position. Rotation of the lever 56 in the direction shown by the arrow in FIG. 4, moves the slot 68 so that the roller bearing 36 is completely captured by the jaw 66. Engagement of the lever 56 and roller bearing 36 provides a mechanical advantage for coupling the connectors 20 and 48 together and also secures the sled 46 to the support plate 26. The lever 56 and roller bearing 36 are preferably positioned so that engagement of the two members moves the drive assembly 12 further into the housing 14, so that the first connector 20 is fully mated with the second connector 48.

As shown in FIGS. 2 and 4, the sled 46 has a locking means for locking the lever 56 in the second position, so that the unit 12 does not inadvertently disengage from the housing 14. Preferably there is a slot or raised portion 99 which engages a flange 72 made from a bent portion of the sled 46. This engagement of flange 72 and raised portion or slot 99 prevents the lever from rotating back to the first position (shown in FIG. 2). The drive assembly 12 can be detached from the housing 14 by merely rotating the lever 56 back to the first position (by disengaging the flange 72 from the raised portion 99) and pulling the drive assembly 12 out of the opening 18.

Figure 7:
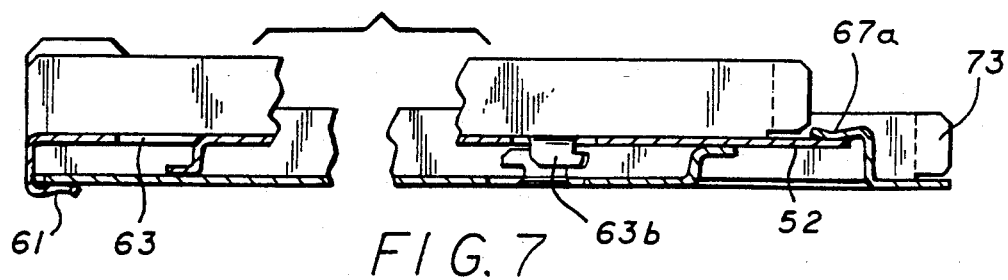
FIG. 7 is a cross-sectional view of FIG. 4, taken at line 7—7.

As can be seen in FIGS. 2, 4, and 7, several interlocks are used to retain the sled assembly 12 to the housing 14. While not required, these interlocks are preferable in that they resist extraordinary vibrations of the components relative to each other. Specifically as shown, interlocks 63a, 63b, 65, 67 and 101 are provided to mate with corresponding structures as shown in FIG. 7, which is a sectional view of FIG. 4 taken through line 7—7. Tabs 67a and 67b are disposed on the support plate 26 at the back end to capture the sled when fully installed and limit vertical travel. Side rails 69 of the sled also help stiffen the sled 46, and tab 73 on side rails 69 help guide the sled within the limits of housing side rails 71.

Figure 5:
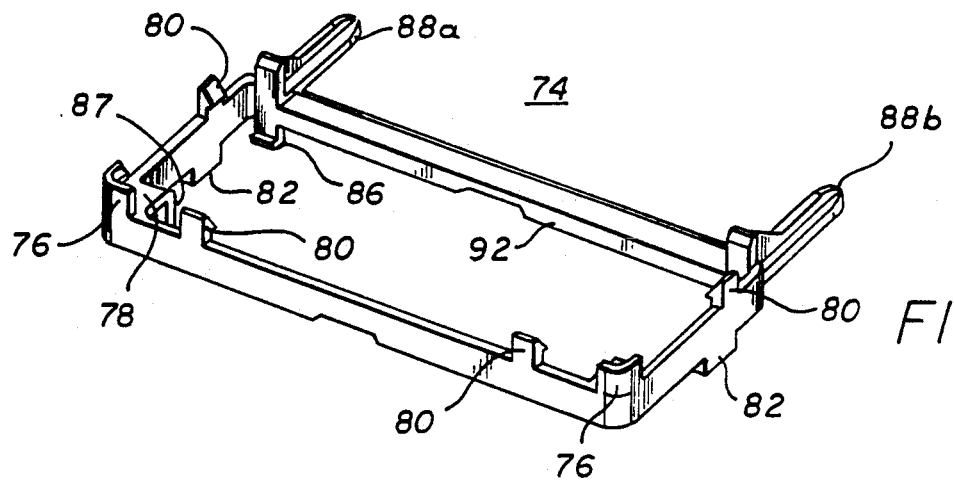
FIG. 5 is a perspective view of a connector frame that couples an electrical connector to the frame of the sled of the present invention.

FIG. 5 shows a connector frame 74 that couples the second connector 48 with its printed circuit board (98 in FIG. 1) to the sled 46. The frame 74 is typically constructed from a molded plastic. The frame 74 has a pair of corners 76 and seats 78 that align and support the second connector 48. The second connector 48 is secured to the frame by four spring tabs 80 that snap onto the housing of the connector 48. The frame 74 also has tabs 82 that are inserted into holes 84 within the sled 46, and L shaped tabs 86 that extend under the front portion of the sled 46. The tabs 86 and 87 attach the connector frame 74 to the sled 46, while allowing the frame 74 to move or "float" relative to the sled 46. Tabs 82 limit the printed circuit board's side to side movement, when a printed circuit board is installed in the frame 74.

Extending from the connector frame 74 are a pair of guide pins 88 that are adapted to be inserted into the alignment holes 24. In the preferred embodiment, the guide pins 88 have cross shaped cross-sections and are tapered at the tip. The guide pins 88 align the second connector 48 with the first connector 20, and together with the connector frame 74 compensate for the tolerances in the assembly 10. For example, when the unit 12 is initially inserted into the opening, the guide pins 88 enter the holes 24 and engage the rear wall 22. If the connectors 20 and 48 are not aligned, further insertion of the sled 12 will cause the connector frame 74 to move relative to the sled 46 so that the connectors can be mated together.

Figure 6:
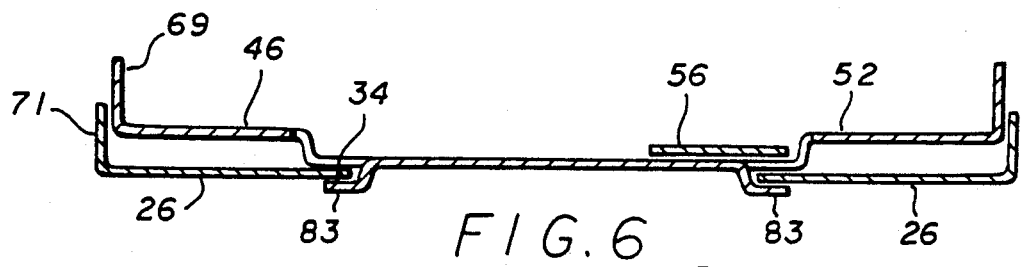
FIG. 6 is a cross-sectional view of FIG. 2, taken at line 6—6.

As shown in FIG. 6, the sled 46 may have hold tabs 83 adapted to engage the second surface 30 of the support plate 26 when the unit 12 is inserted into the housing 14. The coupling of the tabs 83 and support plate 26 provide rough alignment of the unit 12 relative to the housing 14. The tabs 83 are preferably constructed to also provide rough alignment and coarse installation between the sled 46 and the support plate 26. The tabs 83 further secure the sled 12 to the housing to prevent any external vibration or shock from causing excessive displacement of the sled 46 and possible damage to the disk drive module 44.

While certain exemplary embodiments have been described in detail and shown in the accompanying drawings, it is to be understood that such embodiments are merely illustrative of and not restrictive on the broad invention and that this invention not be limited to the specific constructions and arrangements shown and described, since various other modifications may occur to those ordinarily skilled in the art.

What is claimed is:

1. An assembly that can be detachably connected to a computer housing having an opening which exposes a first connector and a bearing, comprising:
   a frame;
   a second connector mounted onto said frame such that said second connector can be coupled to the first connector; and
   a pawl latch assembly comprising a lever pivotally connected to said frame, said lever having a slot adapted to engage the bearing when said lever is rotated from a first position to a second position.

2. The assembly as recited in claim 1, wherein said frame includes a pair of abutment tabs extending essentially perpendicular from a base portion on a first end of said frame.

3. The assembly as recited in claim 1, further comprising alignment means for aligning said second connector with the first connector.

4. The assembly as recited in claim 1, further comprising locking means for locking said lever into said second position.

5. The assembly as recited in claim 4, comprising spring means for biasing said lever into said first position.

6. An assembly that can be detachably connected to a computer housing that has an opening which exposes a first connector mounted to a rear wall that has at least one alignment hole and a roller bearing mounted onto a support plate disposed substantially perpendicular to said rear wall, said support plate having a first surface and a second surface, said assembly comprising:
   a frame adapted to be supported by the first surface of the support plate;
   a second connector mounted onto said frame such that said second connector can be coupled to the first connector;
   a lever pivotally connected to said frame, said lever having a slot adapted to engage the roller bearing and secure said frame to the computer housing when said lever is rotated from a first position to a second position;
   spring means for biasing said lever into said first position;
   locking means for locking said lever into said second position;
   at least one guide pin mounted onto said frame, said guide pin being adapted to be inserted into the alignment hole to align said second connector with the first connector; and,
   at least two hold tabs attached to said frame and being adapted to engage the second surface of the support plate to further secure said frame to the computer housing.

7. The assembly as recited in claim 6, wherein said guide pin extends from a connector frame that couples said second connector to said frame such that said second connector can move relative to said frame to allow said second connector to become aligned with the first connector.

8. The assembly as recited in claim 6, wherein said frame includes a pair of abutment tabs extending essentially perpendicular from a base portion on a first end of said frame.

9. The assembly as recited in claim 6, further comprising an electrical device mounted to said frame and coupled to said second connector.

10. The assembly as recited in claim 9, wherein said electrical device is a hard disk drive.

11. An assembly, comprising:
    a computer housing having an opening which exposes a rear wall and a support plate disposed substantially perpendicular to said rear wall;
    a first connector attached to said rear wall;
    a bearing mounted onto said support plate;
    a frame adapted to be inserted into said opening;
    a second connector mounted onto said frame such that said second connector can be coupled to said first connector;
    an electrical device mounted onto said frame and coupled to said second connector;
    a lever pivotally connected to said frame, said lever having a slot adapted to engage said roller bearing when said lever is rotated from a first position to a second position;
    spring means for biasing said lever into said first position; and, locking means for locking said lever into said second position.

12. The assembly as recited in claim 11, wherein said frame includes a pair of abutment tabs extending essentially perpendicular from a base portion on a first end of said frame.

13. The assembly as recited in claim 11, further comprising alignment means for aligning said second connector with said first connector.

14. An assembly, comprising:
- a computer housing having an opening which exposes a support plate and a rear wall having at least one alignment hole;
- a first connector attached to said rear wall;
- a roller bearing mounted onto said support plate;
- a frame adapted to be inserted into said opening;
- a second connector mounted onto said frame such that said second connector can be coupled to said first connector;
- a electrical device mounted onto said frame and coupled to said second connector;
- a lever pivotally connected to said frame, said lever having a slot adapted to engage said roller bearing when said lever is rotated from a first position to a second position;
- spring means for biasing said lever into said first position;
- locking means for locking said lever into said second position
- at least one guide pin mounted onto said frame, said guide pin being adapted to be inserted into said alignment hole to align said second connector with said first connector; and,
- at least two hold tabs attached to said frame and being adapted to engage the second surface of the support plate to further secure said frame to the computer housing.

15. The assembly as recited in claim 14, wherein said electrical device is a hard disk drive.

16. The assembly as recited in claim 14, wherein said guide pin extends from a connector frame that couples said second connector to said frame such that said second connector can move relative to said frame to allow said second connector to become aligned with said first connector.

17. The assembly as recited in claim 16, wherein said frame includes a pair of abutment tabs extending essentially perpendicular from a base portion on a first end of said frame.

18. A method of coupling a disk drive to a computer, comprising the steps of:
a) providing a computer housing that has an opening which exposes a first connector attached to a rear wall and a bearing means mounted onto a support plate;
b) inserting a drive unit into said opening, said drive unit including a disk drive and a second connector mounted to a frame, said frame further including a lever pivotally connected to said frame and adapted to move between a first position and a second position; and,
c) rotating said lever from said first position to second position such that said lever engages said roller bearing and secures said drive unit to said computer housing.

19. The method as recited in claim 18, further comprising the step of locking said lever in said second position.

20. The method as recited in claim 19, further comprising the steps of unlocking said lever, rotating said lever from said second position to said first position and removing said drive unit from said opening.

* * * * *